United States Patent [19]

Hinn

[11] Patent Number: 4,603,319
[45] Date of Patent: Jul. 29, 1986

[54] DIGITAL-TO-ANALOG CONVERTER WITH REDUCED OUTPUT CAPACITANCE

[75] Inventor: Werner Hinn, Zollikerberg, Switzerland

[73] Assignee: RCA Corporation, Princeton, N.J.

[21] Appl. No.: 644,397

[22] Filed: Aug. 27, 1984

[51] Int. Cl.$^4$ ............................................. H03M 1/00
[52] U.S. Cl. ............................................. 340/347 DA
[58] Field of Search ................................ 340/347 DA

[56] References Cited

U.S. PATENT DOCUMENTS 4,020,486 4/1977 Pastoriza .................... 340/347 DA

OTHER PUBLICATIONS

Selected pages from a technical bulletin of the Semiconductor Division of ITT Corporation, titled "DIGIT 2000 VLSI Digital TV System".

*Primary Examiner*—Bernard Roskoski
*Attorney, Agent, or Firm*—P. J. Rasmussen; P. M. Emanuel; R. H. Kurdyla

[57] ABSTRACT

In a digital video signal processing system including an image displaying kinescope, a digital-to-analog signal converter (DAC) comprises a VMOS transistor arrangement with a gate electrode, a drain electrode from which output analog signals are provided, and plural source areas with associated source electrodes which receive input digital signals. The source areas are binarily scaled to reduce effective output capacitance and power consumption. The DAC is also suitable for directly driving a high level cathode electrode of the kinescope.

11 Claims, 3 Drawing Figures

DIGITAL-TO-ANALOG CONVERTER WITH REDUCED OUTPUT CAPACITANCE

This invention concerns a digital-to-analog signal converter with reduced output capacitance. In particular, this invention concerns such a converter suitable for use as a video output amplifier for driving an image display device in a video signal processing system employing digital video signal processing techniques.

In an electrical signal processing system employing digital signal processing techniques, a digital-to-analog converter network is required to convert digital signals to analog form for use by analog circuits associated with the system. A digital television signal processing system recently introduced by the Worldwide Semiconductor Group (Freiburg, West Germany) of International Telephone and Telegraph Corporation is described in an ITT Corporation publication titled "VLSI Digital TV System—DIGIT 2000." In that system color video signals, after being processed in digital form, are converted to analog form by means of digital-to-analog converters before being coupled to an image displaying kinescope. The analog color video signals are coupled to the kinescope via analog buffer amplifiers and video output kinescope driver amplifiers which provide analog video output signals at a high level suitable for driving intensity control electrodes of the kinescope.

A digital video signal processing system wherein the functions of the output digital-to-analog converter and kinescope driver are advantageously combined, thereby eliminating many of the problems associated with analog kinescope driver stages, is described in my concurrently filed U.S. patent application Ser. No. 644,398 titled "Kinescope Driver in a Digital Video Signal Processing System." As disclosed therein, a converter/driver stage employs high voltage VMOS FET transistor output devices and is capable of directly driving an intensity control electrode such as the cathode electrode of a kinescope in a television receiver or similar video signal processing system employing digital video signal processing techniques.

It is herein recognized as desirable to preserve the high frequency response and to reduce power consumption and power dissipation of a digital-to-analog converter, particularly when used for processing large amplitude signals, by reducing the output capacitance of the converter. Accordingly, there is disclosed herein a digital-to-analog converter which meets these objectives. A digital-to-analog converter as disclosed herein in accordance with the principles of the present invention comprises a plurality of VMOS FET output transistor devices with separate source areas. The dimensions of the respective separate source areas differ such that the VMOS device associated with the most significant digital information bit exhibits the largest source area, whereas VMOS devices associated with less significant bits exhibit smaller source areas. In a preferred implementation of the invention, the source areas of the VMOS output devices are binarily scaled, the gate electrodes of the output devices are connected in common, and the drain electrodes of the output devices are connected in common to an output load impedance.

In addition, the disclosed digital-to-analog converter advantageously is capable of directly driving an intensity control electrode such as the cathode electrode of a kinescope in a television receiver or similar video signal processing system employing digital video signal processing techniques. In such case the need for an analog kinescope driver amplifier stage is eliminated.

Figure 1:
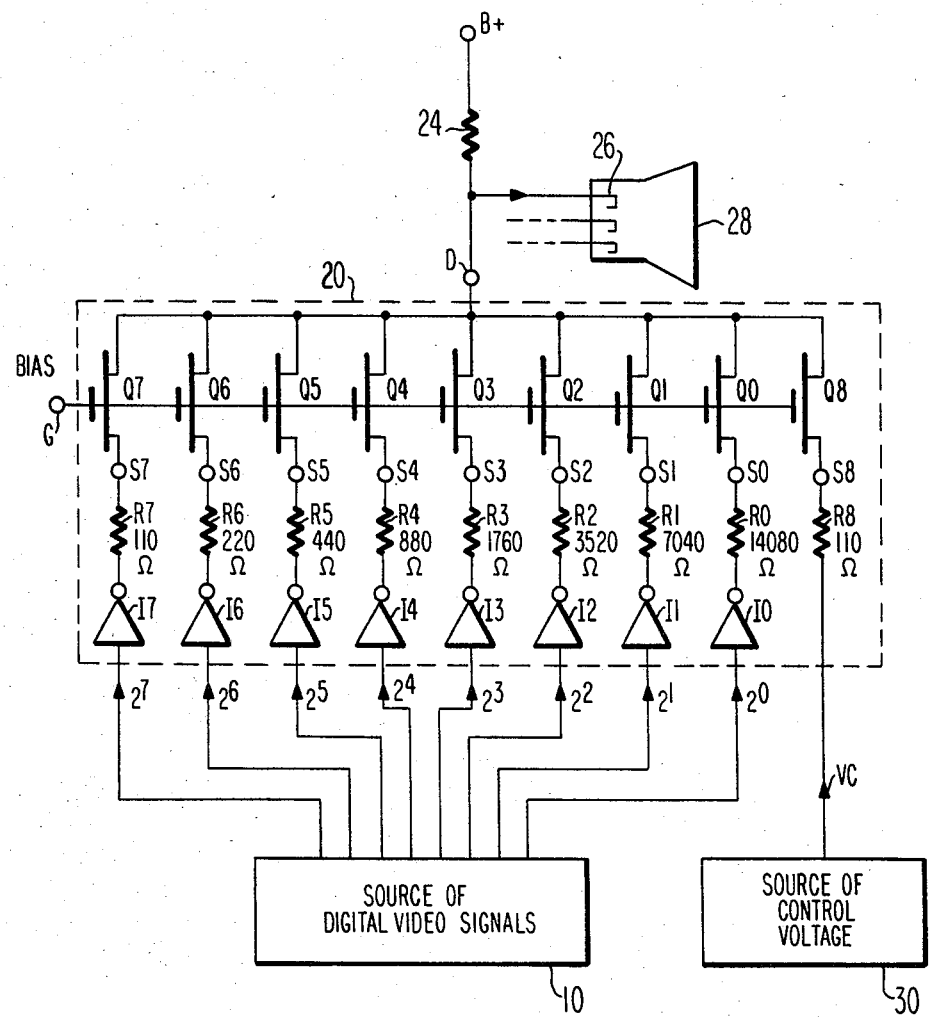
FIG. 1 shows a portion of a television receiver including a digital-to-analog converter in accordance with the present invention.

In FIG. 1, an 8-bit digital video signal in binary form ($2^0 \ldots 2^7$) from a source of digital video signals 10 is applied as an input signal to an 8-bit digital-to-analog converter (DAC) 20. A high level analog output video signal from DAC 20 appears across a load impedance 24 with a magnitude suitable for directly driving a cathode intensity control electrode 26 of an image displaying kinescope 28 such as may be found in a television receiver, video monitor or other similar video processing system. Suitable low pass filtering of the output signal from DAC 20 is provided by means of load resistor 24 and the capacitance associated with the kinescope cathode.

DAC 20 includes a plurality of input inverters I0–I7 which acts as switches and which respectively receive input digital signal bits $2^0 \ldots 2^7$. Inverters I0–I7 may, for example, include bipolar transistors operated as on-off switches. Output signals from inverters I0–I7, as developed in accordance with the logic state of binary input signals $2^0 \ldots 2^7$, are coupled via binary weighted, current determining resistors R0–R7 to an array of high voltage output MOS FET transistor devices Q0–Q7. Devices Q0–Q7 have gate electrodes connected in common to a single gate terminal G to which a bias potential is applied, output drain electrodes connected in common to a single drain output terminal D to which output load impedance 24 is coupled, and separate input source electrode terminals S0–S7 which respectively receive binary weighted signal currents from resistors R0–R7.

Output devices Q0–Q7 preferably are enhancement mode VMOS (Vertical MOS) FET transistor devices such as the BS 107 device type available from ITT of Freiburg, West Germany or the BSS 93 device type available from Siemens of Munich, West Germany. VMOS devices Q0–Q7 have drain and source electrodes arranged along a vertical axis (in contrast to lateral devices which have gate, source and drain elements on the same surface). Devices Q0–Q7 are coupled in parallel and can be readily constructed on a common integrated circuit substrate, preferably together with resistors R0–R7 and switching inverters I0–I7. The vertical structure of the VMOS output devices facilitates the fabrication of these devices with a high breakdown voltage rating, allowing the devices to directly drive the high voltage cathode electrode of kinescope 28.

The VMOS output devices also advantageously exhibit mutually uniform high voltage fast switching characteristics with substantially equal turn-on and turn-off delays, and substantially avoid unwanted switching transients ("glitches") particularly in comparison to the high voltage switching characteristics of bipolar transistors. The turn-on and turn-off times of the VMOS output devices are substantially unaffected by the magnitude of the voltage being switched, whereby high voltage kinescope drive is possible. In addition, VMOS technology readily permits the manufacture of low cost integrated VMOS device arrays with common gate and common drain electrodes.

DAC 20 advantageously exhibits significantly reduced parasitic output capacitance, good large signal slew rate and high frequency response, and reduced power consumption. As will be explained below, these desirable effects result from the fact that the source areas of VMOS output devices Q0–Q8 are dimensioned to exhibit a binary weighting factor, ie., 1:2:4:8:16:32:64:128. In other words, the source areas of output devices Q0–Q7 are proportional to the binary scaled values of associated source resistors R0–R7. Thus the source area of transistor Q0 corresponds to the smallest area ("1") as associated with the least significant bit ($2^0$), and the source area of transistor Q7 corresponds to the largest area ("128") as associated with the most significant bit ($2^7$).

By scaling the source areas of VMOS output devices in this manner, the value of the output parasitic capacitance at terminal D (ie., the total drain capacitance) is significantly reduced, compared to the case where output devices Q0–Q7 exhibit equal source areas. Since in a vertically structured VMOS device the size of the source area (or the number of source cells used) for each output VMOS device primarily determines the area occupied by the device, and since the drain area and drain capacitance are proportional to the area occupied by the VMOS device, a reduction in the source area results in a related reduction in the value of the parasitic output drain capacitance.

The slew rate of DAC 20 (the voltage change per unit time, or dv/dt) is related to the magnitude of current supplied by load resistor 24 divided by the value of capacitance appearing at output terminal D. Thus reducing the effective capacitance at terminal D enhances the slew rate of DAC 20, and also enhances the high frequency response of DAC 20. Reducing the value of the effective output capacitance also reduces the power consumption and dissipation of DAC 20 since these factors are directly proportional to the value of the effective output capacitance.

As will be seen from FIG. 3 which will be discussed subsequently, each output device Q0–Q7 comprises a number of source cells. Output device Q7 associated with the most significant signal bit comprises the largest number of source cells (128), has a high current conducting capability, and contributes the most to the total value of the output drain capacitance. On the other hand, output device Q0 associated with the least significant bit comprises the smallest number of source cells (1), has a low current conducting capability, and contributes least to the total value of output drain capacitance.

The current density is substantially the same for all source areas, since higher currents are conducted by the higher order large area sources, and lower currents are conducted by the lower order small area sources. The magnitude of current conducted by output devices Q0–Q7 is determined by the value of associated source resistors R0–R7. Although the on-resistance (conduction resistance) of the lower order output devices is higher than the on-resistance of the higher order devices because the former devices comprise a small number of paralleled source cells, the drain-to-source voltage drop exhibited by the output devices when conductive is approximately the same for both the higher order and lower order devices because of the similar current densities exhibited by the output devices.

Control of the DC voltage developed at drain output terminal D is provided by means of an additional VMOS transistor Q8 with a source electrode S8 and an associated source resistor R8. A variable DC control voltage VC from a voltage source 30 varies the current conducted by transistor Q8 and thereby varies the voltage developed across load resistor 24 at output terminal D. In a television receiver for example, the arrangement including voltage source 30 and transistor Q8 can be used to adjust the bias of the kinescope cathode such as during receiver servicing and at other times.

Figure 2:
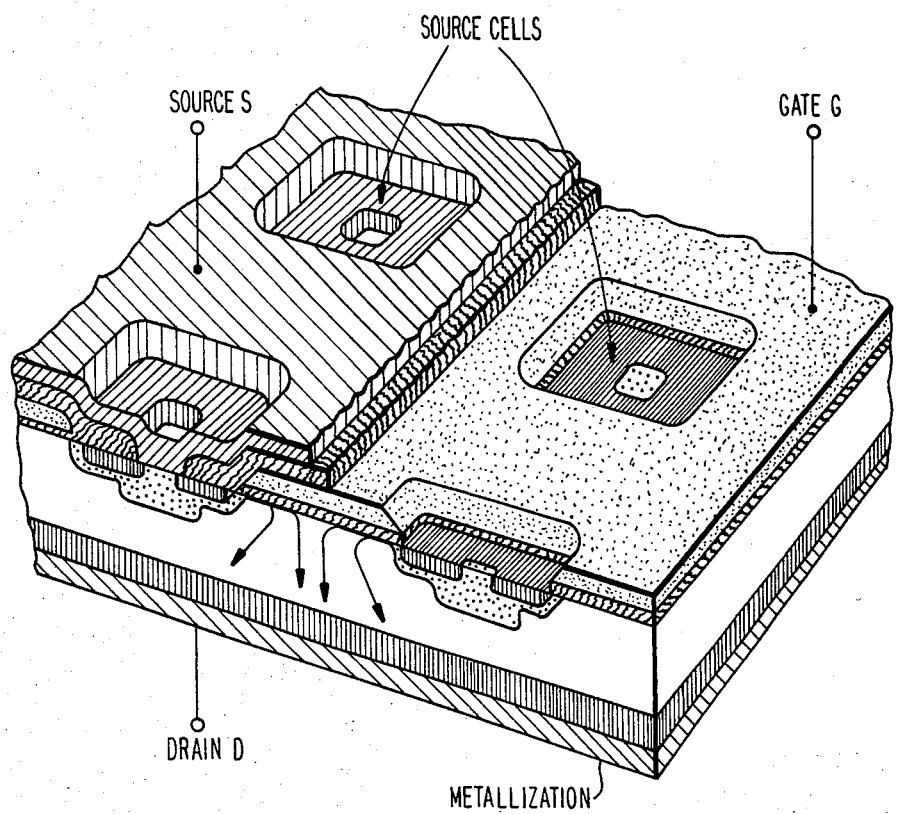
FIG. 2 shows a cross-sectional view of a device forming a constituent part of the digital-to-analog converter shown in FIG. 1.

FIG. 2 shows a cross-sectional view of a VMOS FET structure such as may be used with the arrangement of FIG. 1. The drain body of material consists of and n+ substrate with an n− epitaxial layer deposited on one side and a metallization layer deposited on the other side. Source cells consist of p+ regions diffused into the n− epitaxial layer, with n+ regions diffused into the p+ regions. The geometry of the source cells may vary, eg., be hexagonal or rectangular in shape. The gate consists of an n+ polysilicon layer imbedded in silicon dioxide (SiO2), with apertures centered above the source cells. At some point the gate layer is brought to the surface of the device for metallization and connection to a bonding pad. The source metallization is the uppermost layer of the device and interconnects the individual source cells as required. The breakdown voltage rating of a VMOS device is primarily determined by the resistivity and thickness of the epitaxial layer.

Figure 3:
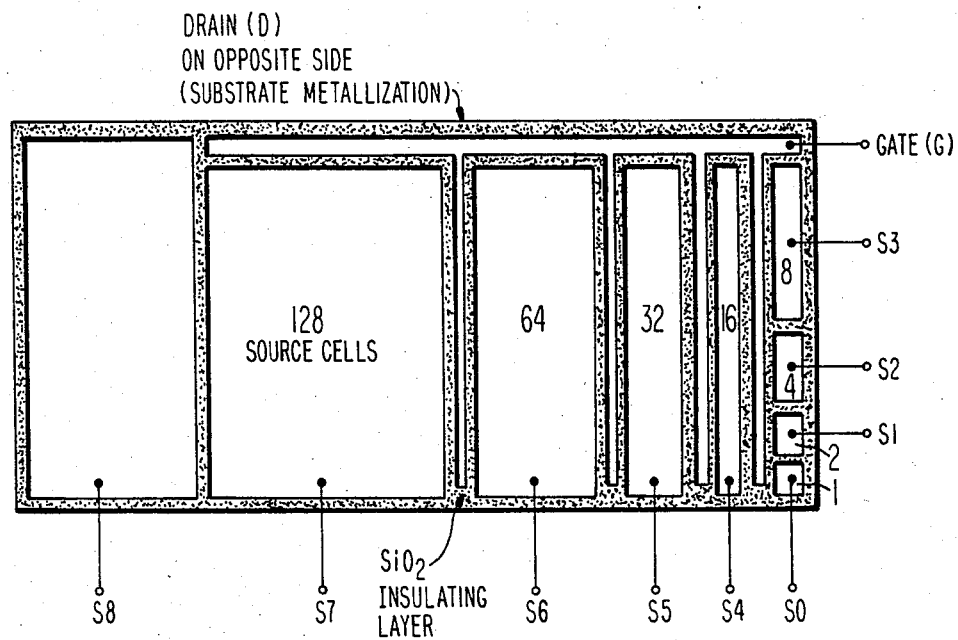
FIG. 3 depicts a plan view of an integrated circuit version of the digital-to-analog converter shown in FIG. 1.

FIG. 3 illustrates a plan view of an integrated circuit including the portion of the FIG. 1 arrangement including devices Q0–Q8. The source areas of devices Q0–Q8, to which source terminals S0–S8 are connected, exhibit a rectangular geometry with rectangular gate elements disposed among the source cell areas as shown. The total source cell areas respectively associated with output devices Q0–Q7 are scaled in a binary ratio (1:2: . . . :128) and are separated by a silicon dioxide (SiO2) insulating layer. An integrated VMOS device of this type can be readily fabricated by slightly modifying certain existing VMOS devices, such as the BSS 93 device type (Siemens) whose plurality of interconnected source cells could be divided into several individual binary scaled source cell areas simply by altering the source cell metallization.

In order to achieve the benefits of reduced power consumption and preserved high frequency response which result from reducing the total effective output capacitance as discussed, it is not necessary to scale the source areas of the VMOS output devices in a binary ratio. Other scaling arrangements can be adapted to the requirements of a given signal processing system, ie., with regard to the requirements of the various digital information codes. In general, however, significant benefits will be obtained when the source areas associated with several of the lower order bits (depending on the total number of bits) are scaled to exhibit reduced area relative to the higher order bits in order to reduce output capacitance, obtain desired source cell current densities, and reduce power consumption.

Although the disclosed arrangement is particularly used for driving a high voltage intensity control cathode electrode of a kinescope in a television receiver for example, the disclosed arrangement can also be used as an audio frequency signal driver with appropriate impedance matching, or as a source of low level analog video signals for supplying separate analog video monitors or receivers from a common source of digital video signals. In general, the disclosed arrangement is useful where a high speed digital-to-analog converter is needed.

A VMOS converter/driver as described herein can advantageously be used in a digital video signal processing and display system wherein viewer generated control signals for normally controlling the brightness and contrast of a displayed image are utilized in analog rather than digital form for controlling the magnitude of the video signal, as disclosed in my concurrently filed U.S. patent application Ser. No. 644,400 titled "Digital Video Signal Processor With Analog Level Control."

What is claimed is:

1. A digital signal processing system comprising:
 a source of digital signals comprising plural binary information bits;
 analog signal utilization means; and
 digital-to-analog signal converter means comprising an array of MOS transistor devices each having gate, drain and source electrodes; wherein
 said source electrodes receive respective ones of said information bits as input signals;
 said drain electrodes are connected in common to said utilization means for providing analog output signals thereto; and wherein for reducing the output capacitance of said converter means
 said transistor devices are vertical MOS transistor devices; and
 said source electrodes have associated source areas, said source areas being respectively scaled in size such that source areas associated with less significant information bits are relatively smaller in size than source areas associated with more significant information bits.

2. A system according to claim 1, wherein
 current determining resistances are respectively coupled to said source electrodes of said VMOS devices; and
 said source areas of said VMOS devices are scaled in accordance with the values of said resistances, respectively, with the largest source area being associated with the smallest resistance value and the smallest source area being associated with the largest resistance value.

3. A system according to claim 1, wherein
 said source areas of said VMOS devices are binarily scaled.

4. A system according to claim 1, wherein
 said gate electrodes are connected in common.

5. A system according to claim 1, wherein
 said utilization means comprises a load impedance coupled to said drain electrodes;
 a further VMOS device is coupled to said load impedance; and
 a source of control signal is coupled to said further VMOS device for controlling the conduction thereof to thereby control the potential developed across said load impedance.

6. A system according to claim 5, wherein
 said further VMOS device has a gate electrode coupled to a bias source, a source electrode coupled to said source of control signal, and a drain electrode coupled to said load impedance.

7. A digital video signal processing system comprising:
 a source of digital video signals comprising plural binary information bits;
 image display means responsive to analog video signals applied to an intensity control electrode thereof; and
 a digital-to-analog signal converter with an input for receiving digital signals from said source of digital signals and an output for providing analog video signals to said intensity control electrode of said display means without further amplification at a voltage suitable for directly driving said intensity control electrode; wherein
 said converter comprises an array of MOS transistor devices each having gate, drain and source electrodes;
 said source electrodes receive respective ones of said information bits as input signals;
 said drain electrodes are connected in common to said display means for providing video output signals thereto; and
 said source electrodes have associated source areas, said source areas being respectively scaled in size such that source areas associated with less significant information bits are relatively smaller in size than source areas associated with more significant information bits.

8. A system according to claim 7, wherein
 said MOS devices are vertical MOS devices.

9. A system according to claim 8, wherein
 said source areas of said VMOS devices are binarily scaled.

10. A digital signal processing system comprising:
 a source of digital signals comprising plural binary information bits;
 analog signal utilization means;
 a plurality of current determining resistances; and
 digital-to-analog signal converter means comprising an array of VMOS transistor devices each having gate, drain and source electrodes, said drain electrodes exhibiting capacitances which collectively determine the output capacitance of said digital-to-analog signal converter means; wherein
 said resistances respectively couple said binary information bits to separate ones of said source electrodes;
 said drain electrodes are connected in common to said utilization means for providing analog output signal thereto; and
 said source electrodes have associated source areas, said source areas being scaled in proportion to the values of respectively associated ones of said resistances whereby said capacitances associated with said drain electrodes are scaled in accordance with the scaling of said source areas.

11. A digital signal processing system comprising:
 a source of digital signals comprising plural binary information bits;
 analog signal utilization means;
 a plurality of binary scaled resistors; and
 digital-to-analog signal converter means comprising an array of VMOS transistor devices each having gate, drain and source electrodes, said drain electrodes exhibiting capacitances which collectively determine the output capacitance of said digital-to-analog signal converter means; wherein
 said binary scaled resistors respectively couple said binary information bits to separate ones of said source electrodes;

said drain electrodes are connected in common to said utilization means for providing analog output signal thereto; and said source electrodes have associated source areas, said source areas being scaled in accordance with the respective values of said resistors such that the largest source area is associated with the smallest resistor value and the smallest source area is associated with the largest resistor value whereby said capacitances associated with said drain electrodes are scaled in accordance with the scaling of said source areas.

* * * * *